(12) United States Patent
Park et al.

(10) Patent No.: US 9,564,476 B2
(45) Date of Patent: Feb. 7, 2017

(54) ORGANIC LIGHT EMITTING DIODE DISPLAY

(71) Applicant: Samsung Display Co., Ltd., Yongin, Gyeonggi-Do (KR)

(72) Inventors: Kyung Hoon Park, Suwon-si (KR); Jeong Hwan Kim, Hwaseong-si (KR); Sun Park, Suwon-si (KR); Won ho Jang, Mokpo-si (KR); Joo hyeon Jo, Asan-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/808,968

(22) Filed: Jul. 24, 2015

(65) Prior Publication Data
US 2016/0204174 A1 Jul. 14, 2016

(30) Foreign Application Priority Data

Jan. 14, 2015 (KR) .................. 10-2015-0007025

(51) Int. Cl.
*H01L 27/32* (2006.01)
(52) U.S. Cl.
CPC ....... *H01L 27/3258* (2013.01); *H01L 27/3246* (2013.01)
(58) Field of Classification Search
CPC ............. H01L 51/0545; H01L 51/0036; H01L 51/0541; H01L 51/5012
See application file for complete search history.

(56) References Cited

U.S. PATENT DOCUMENTS 9,000,430 B2 * 4/2015 Isobe .................. H01L 51/5231
257/40

FOREIGN PATENT DOCUMENTS

| JP | 2007-157470 A | 6/2007 |
|---|---|---|
| KR | 10-2006-0078549 A | 7/2006 |
| KR | 10-2011-0019498 A | 2/2011 |
| KR | 10-1398448 B1 | 5/2014 |

* cited by examiner

*Primary Examiner* — Quoc Hoang
(74) *Attorney, Agent, or Firm* — Knobbe Martens Olson & Bear LLP

(57) ABSTRACT

An organic light emitting display device comprises a common voltage line formed over a peripheral region of a substrate; a passivation layer formed over a pixel region of the substrate and the peripheral region; pixel electrodes formed over the pixel region; and a pixel defining layer formed over the pixel region and the peripheral region. The pixel defining layer defines pixel openings overlapping the pixel electrodes, respectively. The device further comprises organic light emitting layers formed over the pixel region, and disposed in the pixel openings and over the pixel electrodes, respectively; and a common electrode formed over the pixel and peripheral regions. The common electrode is disposed over the pixel defining layer and the organic light emitting layers. The common electrode contacts the common voltage line. The passivation layer comprises a portion overlapping the common voltage line but not overlapping the pixel defining layer.

20 Claims, 4 Drawing Sheets

ORGANIC LIGHT EMITTING DIODE DISPLAY

CROSS-REFERENCE TO RELATED APPLICATION

This application claims priority to and the benefit of Korean Patent Application No. 10-2015-0007025 filed in the Korean Intellectual Property Office on Jan. 14, 2015, the entire contents of which are incorporated herein by reference.

BACKGROUND

1. Field

The present disclosure relates to an organic light emitting diode display.

2. Description of the Related Art

An organic light emitting diode display includes two electrodes and an organic light emission layer interposed therebetween. Electrons injected from a cathode that is one electrode and holes injected from an anode that is the other electrode are bonded to each other in the organic light emission layer to form excitons, and light is emitted while the excitons discharge energy.

In the organic light emitting diode display, each unit pixel includes transistors including a switching transistor and a driving transistor, a capacitor, and an organic light emitting diode OLD.

The above information disclosed in this Background section is only for enhancement of understanding of the background of the disclosure and therefore it may contain information that does not form the prior art that is already known in this country to a person of ordinary skill in the art.

SUMMARY

The present disclosure provides an organic light emitting diode display comprising a thick layer disposed under a common electrode and configured such that the thick layer is protected from lifting up or being detached from another layer which may cause defects of the common electrode, thereby minimizing or reducing short-circuit or other defects of the common electrode formed over the thick organic layer.

One aspect provides an organic light emitting diode display, which may comprise: a substrate comprising a major surface which comprises a pixel region and a peripheral region next to the pixel region; a transistor formed over the substrate and configured to switch a pixel; a pixel-area passivation layer formed over the transistor; a pixel electrode formed over the pixel-area passivation layer; a pixel partition wall layer formed over the pixel-area passivation layer and covering an edge portion of the pixel electrode, the pixel partition wall layer defining a pixel opening; an organic light emission layer received in the pixel opening and placed over the pixel electrode; a common electrode formed over the organic light emission layer and the pixel partition wall layer, wherein the transistor, the pixel-area passivation layer, the pixel electrode, the pixel partitioning wall layer, the organic light emission layer and the common electrode are formed over the pixel region; a common voltage line formed over the substrate and configured to transmit a common voltage to the common electrode while being in contact with the common electrode; a peripheral passivation layer formed over the substrate and covering an end portion of the common voltage line; and a peripheral partition wall layer formed over the peripheral passivation layer and spaced apart from the common voltage line when viewed in a viewing direction perpendicular to the major surface, wherein the common voltage line, the peripheral passivation layer and the peripheral partition wall layer are formed over the peripheral region.

In the foregoing display, when viewed in the viewing direction, the peripheral partition wall layer may be positioned between the common voltage line and the pixel region while being spaced apart from the common voltage line. The peripheral partition does not overlap an edge portion of the peripheral passivation layer when viewed in the viewing direction. The edge portion of the peripheral passivation layer may be formed to be tapered at an inclination angle smaller than about 30°. Heights of an upper surface of the common voltage line, an upper surface of the edge portion of the peripheral passivation layer, and an upper surface of the edge portion of the peripheral partition wall layer may be increased in this order to form a step.

Still in the foregoing display, a thickness of the peripheral passivation layer may be smaller than a thickness of the pixel-area passivation layer. The thickness of the peripheral passivation layer may be larger than a thickness of the common voltage line and may be smaller than a thickness of the peripheral partition wall layer. The thickness of the peripheral partition wall layer may be larger than a thickness of the pixel partition wall layer. A sum of the thicknesses of the pixel-area passivation layer and the pixel partition wall layer may be the same as a sum of the thicknesses of the peripheral passivation layer and the peripheral partition wall layer. The transistor may include a gate electrode, a semiconductor, a source electrode, and a drain electrode, and the common voltage line is formed of the same material as that of the source electrode and the drain electrode. The common voltage line may be in contact with a portion of the common electrode which is not covered by the peripheral passivation layer. The display may further comprise: a common voltage pad to which the common voltage is applied from the outside; and a common voltage connecting part configured to connect the common voltage pad and the common voltage line, wherein the common voltage connecting part is formed of the same material as that of the gate electrode.

Another aspect provides an organic light emitting display device, which may comprise: a substrate comprising a surface which comprises a pixel region and a peripheral region next to the pixel region; a plurality of thin film transistors formed over the pixel region; a common voltage line formed over the peripheral region; a passivation layer formed over the pixel region and the peripheral region, the passivation layer covering the plurality of transistors; a plurality of pixel electrodes formed over the pixel region, each of the plurality of pixel electrodes being disposed over the passivation layer and electrically connected to one of the plurality of thin film transistors; a pixel defining layer formed over the pixel region and the peripheral region, the pixel defining layer defining a plurality of pixel openings, each of which overlaps one of the plurality of pixel electrodes; a plurality of organic light emitting layers formed over the pixel region, each of the plurality of organic light emitting layers being disposed in one of the pixel openings and over one of the plurality of pixel electrodes; and a common electrode formed over the pixel region and the peripheral region, the common electrode being disposed over the pixel defining layer and the plurality of organic light emitting layers, the common electrode being disposed over and contacting the common voltage line, wherein the passivation layer comprises a portion contacting the common electrode, the portion overlapping the common voltage line but not overlapping the pixel defining layer when viewed in a direction perpendicular to the surface of the substrate.

In the foregoing device, the pixel defining layer does not comprise a portion that overlaps the common voltage line when viewed in the direction. The pixel defining layer does not contact the common voltage line. The pixel defining layer may be spaced from the common voltage line when viewed in the direction. The passivation layer may further comprise another portion disposed over the peripheral region and not overlapping the common voltage line, wherein the portion has a thickness smaller than that of the other portion. Each of the pixel defining layer, the passivation layer and the common voltage line may comprise an edge disposed over the peripheral region, wherein the edge of the common voltage line may be disposed between the edge of the passivation layer and the edge of the pixel defining layer. Each of the thin film transistors comprises a gate electrode, wherein the device further comprises a common voltage connecting conductor layer formed over the peripheral region and contacting the common voltage line, wherein the common voltage line is disposed between the common voltage connecting conductor layer and the common electrode, wherein the common voltage connecting conductor layer may be formed of a material the same as that of the gate electrode. Each of the thin film transistor comprises a source electrode and a drain electrode, wherein the common voltage line may be formed of a material the same as the source and drain electrodes.

According to the exemplary embodiment of the present disclosure, in the organic light emitting diode display, the end portion of the common voltage line in the surrounding area is covered with the surrounding passivation layer having a small thickness, the edge portion of the surrounding partition wall having a large thickness is formed on the surrounding passivation layer, and the edge portion of the surrounding partition wall is positioned between the common voltage line and the pixel area, so that the surrounding partition wall may not be in contact with the common voltage line, but may be in contact with the surrounding passivation layer, thereby enhancing adhesive force of the surrounding partition wall. Accordingly, it is possible to prevent the edge portion of the surrounding partition wall having a large thickness from being lifted up.

Further, the common electrode covering the upper surface of the surrounding partition wall may be prevented from being short-circuited, thereby removing an abnormal heating phenomenon of the organic light emitting diode display.

Further, adhesive force between the surrounding passivation layer that is an organic layer and the surrounding partition wall that is an organic layer is excellent, so that it is possible to thickly form the surrounding partition wall, thereby minimizing a parasitic capacitor generated between the transistor and the common electrode.

Further, the edge portion of the surrounding passivation layer may be formed to be tapered by using a half tone mask, thereby improving step coverage of the common electrode.

DETAILED DESCRIPTION OF EMBODIMENTS

Figure 1:
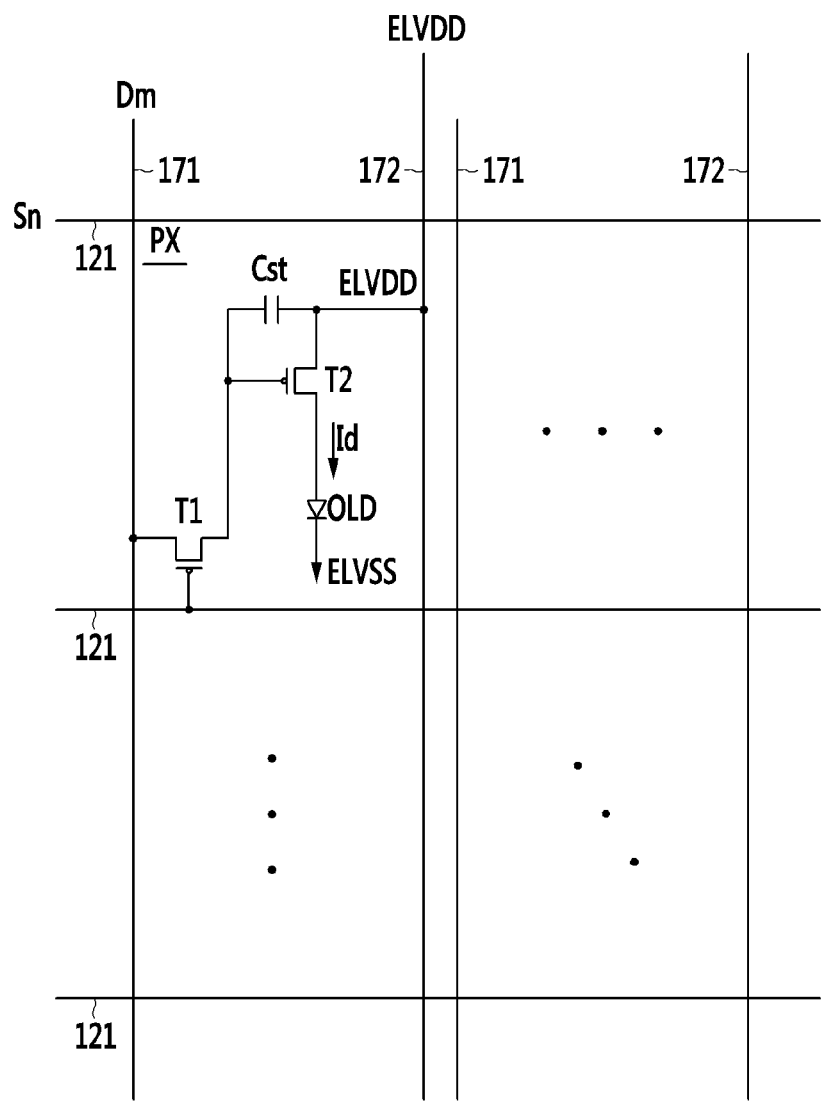
FIG. 1 is an equivalent circuit diagram of one pixel of an organic light emitting diode display according to an embodiment of the present disclosure.

The present disclosure will be described more fully hereinafter with reference to the accompanying drawings, in which embodiments of the invention are shown. As those skilled in the art would realize, the described embodiments may be modified in various different ways, all without departing from the spirit or scope of the present disclosure.

In addition, the size and thickness of each configuration shown in the drawings are arbitrarily shown for understanding and ease of description, but the present disclosure is not limited thereto. In the drawings, the thickness of layers, films, panels, regions, etc., are exaggerated for clarity. In the drawings, for convenience of the description, thicknesses of some layers and areas are exaggerated.

In the specification, unless explicitly described to the contrary, the word "comprise" and variations such as "comprises" or "comprising", will be understood to imply the further inclusion of other elements. Further, in the specification, it will be understood that when an element such as a layer, a film, a region, or a substrate is referred to as being "over" or "on" another element, it can be "directly on" the other element or intervening elements may also be present. Further, the word "over" or "on" means positioning on or below the object portion, but does not essentially mean positioning on the upper side of the object portion based on a gravity direction.

Further, throughout the specification, the term "according to a plane" means a case where a target portion is viewed from the above, and the term "according to a cross section" means a case where a cross section taken by vertically cutting a target portion is viewed from the side.

In addition, in the accompanying drawing, an active matrix (AM) type organic light emitting diode display, which has a 2Tr-1Cap structure including two thin film transistors (TFTs) and one capacitor in one pixel is illustrated, but the present disclosure is not limited thereto. Accordingly, the organic light emitting diode display may include a plurality of transistors and one or more capacitors in one pixel, and a separate wire may be further formed or the existing wire may be omitted to provide various structures. Here, the pixel means a minimum unit displaying an image, and the organic light emitting diode display displays an image through a plurality of pixels.

Generally, in the organic light emitting diode display, each pixel includes transistors including a switching transistor and a driving transistor, a capacitor, and an organic light emitting diode OLD, and a driving voltage ELVDD is provided to the driving transistor and the capacitor from a driving voltage line. The driving voltage line serves to control a current flowing to the organic light emitting diode through the driving transistor. A common voltage line connected to the cathode supplies a common voltage ELVSS to a common electrode that is a cathode and forms a potential difference between an anode and the cathode connected to the driving transistor and the cathode to make a current flow. The common voltage line receives the common voltage from the outside through a common voltage pad formed in a peripheral area of a pixel area, in which a plurality of pixels is formed, and is in contact with the common electrode through a common voltage contact part.

A pixel-area passivation layer and a pixel partition wall formed between the transistor and the common electrode may be formed with a large thickness in the pixel area to remove a parasitic capacitor between the transistor and the common electrode.

However, when the pixel-area passivation layer and the pixel partition wall formed of an organic layer are cured, stress of the organic layer increases in proportion to the large thickness of the pixel-area passivation layer and the pixel partition wall, so that the common voltage line positioned in the peripheral area and the peripheral partition wall may be easily spaced apart from each other. Particularly, in some instances, the amount of solvent is large inside the organic layer, and the solvent fails to be sufficiently evaporated during the curing process, thereby easily generating outgassing, and in this case, adhesive force between an edge portion of the peripheral partition wall and the common voltage line deteriorates, so that the peripheral partition wall is lifted up. In this case, a common electrode deposited on both the peripheral partition wall and the common voltage line is easily short-circuited, and thus, in supplying the common voltage ELVSS, a heating phenomenon is generated in the organic light emitting diode display.

Then, an organic light emitting diode display according to an embodiment of the present disclosure will be described in detail with reference to FIGS. 1, 2, 3, and 4.

FIG. 1 is an equivalent circuit diagram of one pixel of an organic light emitting diode display according to an embodiment of the present disclosure.

As illustrated in FIG. 1, an organic light emitting diode display according to an embodiment of the present disclosure includes a plurality of signal lines 121, 171, and 172, and a plurality of pixels PX connected to the plurality of signal lines and approximately arranged in a matrix form.

The signal lines 121, 171, and 172 include a plurality of scan lines 121 transmitting a scan signal Sn, a plurality of data lines 171 crossing the scan lines 121 and transmitting a data signal Dm, and a plurality of driving voltage lines 172 transmitting a driving voltage ELVDD. The scan lines 121 are approximately extended in a row direction and are parallel to each other, and the data lines 171 and the driving voltage lines 172 are approximately extended in a column direction and are almost parallel to each other.

Each pixel PX includes a plurality of transistors T1 and T2 connected to the plurality of signal lines 121, 171, and 172, respectively, a storage capacitor Cst, and an organic light emitting diode OLD.

The transistors T1 and T2 include a switching transistor T1 connected to the data line 171, and a driving transistor T2 connected to the organic light emitting diode OLD.

The switching transistor T1 includes a control terminal, an input terminal, and an output terminal, and the control terminal thereof is connected to the scan line 121, the input terminal thereof is connected to the data line 171, and the output terminal thereof is connected to the driving transistor T2. The switching transistor T1 transmits the data signal Dm applied to the data line 171 to the driving transistor T2 in response to the scan signal Sn applied to the scan line 121.

The driving transistor T2 also includes a control terminal, an input terminal, and an output terminal, and the control terminal thereof is connected to the switching transistor T1, the input terminal thereof is connected to the driving voltage line 172, and the output terminal thereof is connected to the organic light emitting diode OLD. The driving transistor T2 allows a driving current Id, which has a level varying according to a voltage applied between the control terminal and the output terminal, to flow.

The storage capacitor Cst is connected between the control terminal and the input terminal of the driving transistor T2. The storage capacitor Cst charges the data signal applied to the control terminal of the driving transistor T2 and maintains the data signal even after the switching transistor T1 is turned off.

The organic light emitting diode OLD includes an anode that is connected to the output terminal of the driving transistor T2, and a cathode that is connected to the common voltage ELVSS. The organic light emitting diode OLD emits light with an intensity varying according to the driving current Id of the driving transistor T2, thereby displaying an image.

The switching transistor T1 and the driving transistor T2 may be an n-channel field effect transistor FET or a p-channel field effect transistor. In addition, a connection relationship among the transistors T1 and T2, the storage capacitor Cst, and the organic light emitting diode OLD may be changed.

Then, a structure of the organic light emitting diode display according to the embodiment of the present disclosure, which is illustrated in FIG. 1, will be described in detail with reference to FIGS. 2, 3, and 4 together with FIG. 1.

Figure 2:
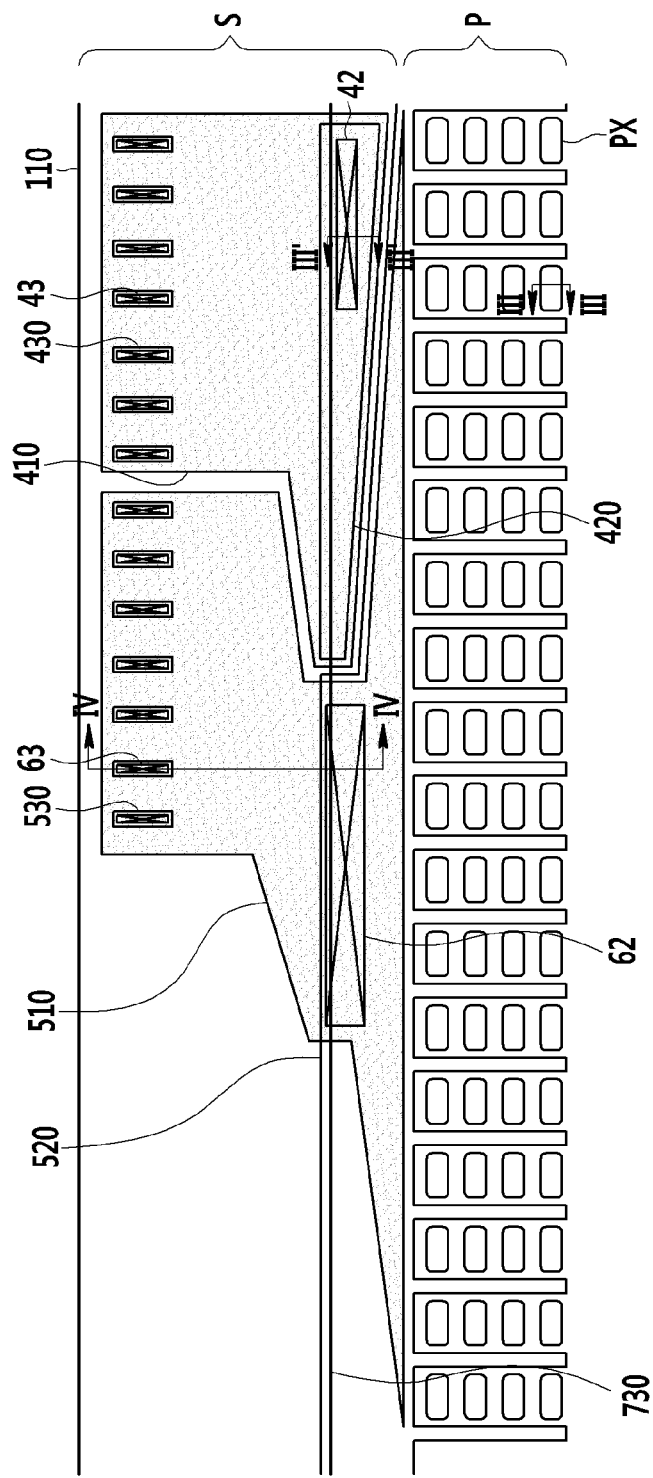
FIG. 2 is a schematic top plan view of a pixel area and a peripheral area of the organic light emitting diode display according to the embodiment of the present disclosure.
Figure 3:
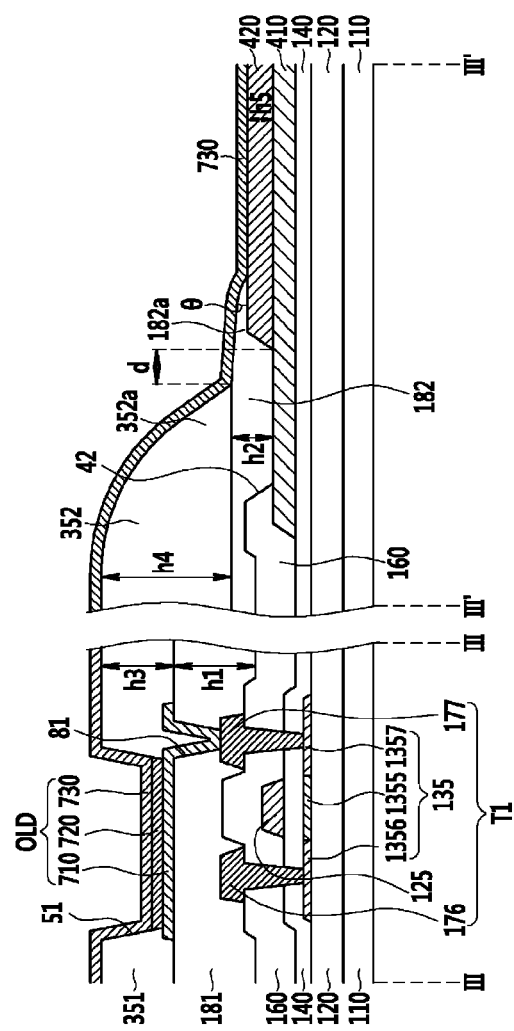
FIG. 3 is a cross-sectional view taken along line III-III of the pixel area and line III'-III' of the peripheral area of FIG. 2.
Figure 4:
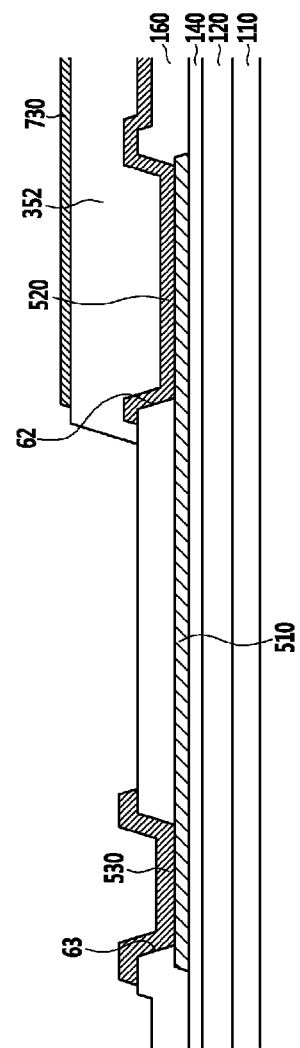
FIG. 4 is a cross-sectional view taken along line IV-IV of the peripheral area of FIG. 2.

FIG. 2 is a schematic top plan view of a pixel area and a peripheral area of the organic light emitting diode display according to the embodiment of the present disclosure, FIG. 3 is a cross-sectional view taken along line III-III of the pixel area and line III'-III' of the peripheral area of FIG. 2, and FIG. 4 is a cross-sectional view taken along line IV-IV of the peripheral area of FIG. 2.

As illustrated in FIG. 2, the organic light emitting diode display according to the embodiment of the present disclosure includes a substrate 110, a pixel area P formed on the substrate 110 and including a plurality of pixels PX, and a peripheral area S surrounding or disposed next to the pixel area P.

The plurality of transistors for switching the pixel PX is formed in the pixel area P.

Hereinafter, a detailed structure of the pixel area P including the plurality of transistors will be described in detail with reference to FIGS. 2 and 3. In this case, the structure of the pixel area P will be described based on the driving transistor, and the switching transistor mostly has the same stack structure as that of the driving transistors, so that a detailed description thereof will be omitted.

As illustrated in FIGS. 2 and 3, a buffer layer 120 is formed on the substrate 110 on which the pixel area P is formed. The substrate 110 may be formed of an insulating substrate made of glass, quartz, ceramic, plastic, and the like, and the buffer layer 120 may serve to improve a characteristic of polycrystalline silicon and reduce stress applied to the substrate 110 by blocking impurities from the substrate 110 during a crystallization process for forming polycrystalline silicon.

A semiconductor 135 is formed on the buffer layer 120. The semiconductor 135 may be formed of polycrystalline silicon or an oxide semiconductor. The oxide semiconductor may include any one of oxides having titanium (Ti), hafnium (Hf), zirconium (Zr), aluminum (Al), tantalum (Ta), germanium (Ge), zinc (Zn), gallium (Ga), tin (Sn), or indium (In) as a base, and complex oxides thereof, such as an indium-gallium-zinc oxide ($InGaZnO_4$), indium-zinc oxide (Zn—In—O), a zinc-tin oxide (Zn—Sn—O), an indium-gallium oxide (In—Ga—O), an indium-tin oxide (In—Sn—O), an indium-zirconium oxide (In—Zr—O), an indium-zirconium-zinc oxide (In—Zr—Zn—O), an indium-zirconium-tin oxide (In—Zr—Sn—O), an indium-zirconium-gallium oxide (In—Zr—Ga—O), an indium-aluminum oxide (In—Al—O), an indium-zinc-aluminum oxide (In—Zn—Al—O), an indium-tin-aluminum oxide (In—Sn—Al—O), an indium-aluminum-gallium oxide (In—Al—Ga—O), an indium-tantalum oxide (In—Ta—O), an indium-tantalum-zinc oxide (In—Ta—Zn—O), an indium-tantalum-tin oxide (In—Ta—Sn—O), an indium-tantalum-gallium oxide (In—Ta—Ga—O), an indium-germanium oxide (In—Ge—O), an indium-germanium-zinc oxide (In—Ge—Zn—O), an indium-germanium-tin oxide (In—Ge—Sn—O), an indium-germanium-gallium oxide (In—Ge—Ga—O), a titanium-indium-zinc oxide (Ti—In—Zn—O), and a hafnium-indium-zinc oxide (Hf—In—Zn—O). When the semiconductor 135 is formed of the oxide semiconductor, a separate passivation layer may be added in order to protect the oxide semiconductor which is vulnerable to an external environment, such as a high temperature environment.

The semiconductor 135 is divided into a channel 1355, and a source region 1356 and a drain region 1357 formed at both sides of the channel 1355. The channel 1355 of the semiconductor 135 is channel-doped with a doping impurity, such as an N-type impurity or a P-type impurity, and the source region 1356 and the drain region 1357 of the semiconductor 135 are contact doping regions in which a doping concentration of a doping impurity is larger than that of the doping impurity of the channel-doping.

A gate insulating layer 140 for covering the semiconductor 135 is formed on the semiconductor 135. The gate insulating layer 140 may be formed of a silicon nitride (SiNx) or a silicon oxide ($SiO_2$).

A gate electrode 125 is formed on the gate insulating layer 140 of the pixel area P. The gate electrode 125 may be a part of the scan line 121, and overlaps the channel 1355.

An interlayer insulating layer 160 for covering the gate electrode 125 is formed on the gate electrode 125. The interlayer insulating layer 160 may be formed of a silicon nitride (SiNx) or a silicon oxide ($SiO_2$), similar to the gate insulating layer 140.

A source electrode 176 and a drain electrode 177 are formed on the interlayer insulating layer 160 of the pixel area P. The source electrode 176 and the drain electrode 177 are connected to the source region 1356 and the drain region 1357, respectively. The semiconductor 135, the gate electrode 125, the source electrode 176, and the drain electrode 177 form the driving transistor T2.

A pixel-area passivation layer 181 for covering the source electrode 176 and the drain electrode 177 of the pixel area P is formed on the source electrode 176 and the drain electrode 177 of the pixel area P.

A pixel electrode 710 formed of a transparent conductor, such as an ITO or an IZO, is formed on the pixel-area passivation layer 181. The pixel electrode 710 is electrically connected with the drain electrode 177 of the driving transistor T2 through a contact hole 81 formed in the pixel-area passivation layer 181 to be the anode of the organic light emitting diode OLD.

A pixel partition wall or pixel defining layer 351 is formed on the pixel-area passivation layer and covers the pixel-area passivation layer 181 and edge portions of the pixel electrode 710. The pixel partition wall 351 defines a plurality of pixel openings 51 for exposing the pixel electrodes 710. The pixel partition wall 351 may be formed to include a resin, such as polyacrylates or polyimides, a silica-based inorganic material, or the like.

An organic light emission layer 720 is formed in the pixel opening 51 of the pixel partition wall 351. The organic light emission layer 720 is formed in a multilayer including one or more of a light emission layer, a hole injection layer (HIL), a hole transporting layer (HTL), an electron transporting layer (ETL), and an electron injection layer (EIL). When the organic light emission layer 720 includes all of the light emission layer, the hole injection layer (HIL), the hole transporting layer (HTL), the electron transporting layer (ETL), and the electron injection layer (EIL), the hole injection layer is positioned on the pixel electrode 710, which is the anode, and the hole transporting layer, the light emission layer, the electron transporting layer, and the electron injection layer are sequentially stacked on the hole injection layer.

A common electrode 730 is formed on the pixel partition wall 351 of the pixel area P and the organic light emission layer 720. The common electrode 720 becomes the cathode of the organic light emitting diode OLD. The pixel electrode 710, the organic light emission layer 720, and the common electrode 730 form the organic light emitting diode OLD together.

In the meantime, a detailed structure of the peripheral area of the organic light emitting diode display according to the embodiment of the present disclosure will be hereinafter described in detail with reference to FIGS. 2, 3, and 4.

As illustrated in FIG. 2, in the peripheral area P, a common voltage line 420 for transmitting the common voltage ELVSS to the common electrode 730 is formed, a plurality of common voltage pads 430, to which the common voltage ELVSS is applied from the outside, is formed, and a common voltage connecting part 410 for connecting the common voltage pad 430 and the common voltage line 420 is formed between the common voltage pad 430 and the common voltage line 420.

The common voltage connecting part 410 is connected with the common voltage line 420 through a contact hole 42 formed in the interlayer insulating layer 160, and is connected with the common voltage pad 430 through a contact hole 43 formed in the interlayer insulating layer 160.

Further, in the peripheral area S, a peripheral driving voltage line 520 for transmitting the driving voltage ELVDD to the pixel electrode 710 is formed, a plurality of driving voltage pads 530, to which the driving voltage ELVDD is applied from the outside, is formed, and a driving voltage connecting part 510 for connecting the driving voltage pad 530 and the peripheral driving voltage line 520 is formed.

The driving voltage connecting part 510 is connected with the peripheral driving voltage line 520 through a contact hole 62 formed in the interlayer insulating layer 160, and is connected with the driving voltage pad 530 through a contact hole 63 formed in the interlayer insulating layer 160.

In the peripheral area S, the buffer layer 120 is formed on the substrate 110, and the gate insulating layer 140 is formed on the buffer layer 120.

The common voltage connecting part 410 for connecting the common voltage pad 430 and the common voltage line 420 is formed on the gate insulating layer 140 of the peripheral area S. The common voltage connecting part 410 is formed of the same material as that of the gate electrode 125. Further, the driving voltage connecting part 510 is formed of the same material as that of the common voltage connecting part 410. During manufacturing the device, in embodiments, a single conductor material layer is formed over the substrate and then patterned into the gate electrode 125, the driving voltage connecting part 510 and the common voltage connecting part 410.

The interlayer insulating layer 160 formed on the gate insulating layer 140 covers only an end portion of the common voltage connecting part 410 positioned in the peripheral area S to expose a part of the common voltage connecting part 410.

The common voltage line 420 is formed on the common voltage connecting part 410 which is not covered by the interlayer insulating layer 160 and is exposed in the peripheral area S. The common voltage line 420 is in direct contact and connected with the common voltage connecting part 410. The common voltage line 420 is formed of the same material as that of the source electrode 176 and the drain electrode 177. Further, the peripheral driving voltage line 520 and the driving voltage pad 530 are formed of the same material as that of the common voltage line 420. During manufacturing the device, in embodiments, a single conductor material layer is formed over the substrate and then patterned into the common voltage line 420, the source electrode 176, the drain electrode 177, the peripheral driving voltage line 520 and the driving voltage pad 530.

A peripheral passivation layer 182 for covering the interlayer insulating layer 160 is formed on the interlayer insulating layer 160 in the peripheral area S. In embodiments, the pixel-area passivation layer 181 and the peripheral passivation layer 182 may be integrated in a passivation layer which is a single layer formed in the pixel area and peripheral area.

The peripheral passivation layer 182 covers end portions of the exposed common voltage connecting part 410 and common voltage line 420. An edge portion 182a of the peripheral passivation layer 182 is formed to be tapered at an inclined angle θ smaller than 30°. The edge portion 182a of the peripheral passivation layer 182 may be formed to be tapered by using a half tone mask. As described above, the edge portion 182a of the peripheral passivation layer 182 is formed to be tapered by using the half tone mask, so that it is possible to improve step coverage of the common electrode 730 stacked on the peripheral passivation layer 182.

A peripheral partition wall or an extended pixel defining layer 352 is formed on the peripheral passivation layer 182 while being spaced apart from the common voltage line 420. In embodiments, the pixel partitioning wall 351 and the peripheral partitioning wall 352 may be integrated into a single pixel defining layer formed in the pixel area and peripheral area.

An edge portion 352a of the peripheral partition wall 352 is positioned between the common voltage line 420 and the pixel area P while being spaced apart from the common voltage line 420 by a predetermined interval d. Accordingly, the peripheral partition wall 352 exposes the edge portion 182a of the peripheral passivation layer 182. Accordingly, heights of an upper surface of the common voltage line 420, an upper surface of the edge portion 182a of the peripheral passivation layer 182, and an upper surface of the edge portion 352a of the peripheral partition wall 352 are increased in this order to form a step.

In this case, a thickness h2 of the peripheral passivation layer 182 may be smaller than a thickness h1 of the pixel-area passivation layer 181, and a thickness h4 of the peripheral partition wall 352 may be larger than a thickness h3 of the pixel partition wall 351. Accordingly, a sum (h1+h3) of the thicknesses of the pixel-area passivation layer 181 and the pixel partition wall 351 may be substantially the same as a sum h2+h4 of the thicknesses of the peripheral passivation layer 182 and the peripheral partition wall 352. Further, the thickness h2 of the peripheral passivation layer 182 is larger than a thickness h5 of the common voltage line 420, and is smaller than the thickness h4 of the peripheral partition wall 352.

As described above, the end portion of the common voltage line 420 in the peripheral area S is covered with the peripheral passivation layer 182 having a small thickness, the edge portion 352a of the peripheral partition wall 352 having a large thickness is formed on the peripheral passivation layer 182, and the edge portion 352a of the peripheral partition wall 352 is positioned between the common voltage line 420 and the pixel area P, so that the peripheral partition wall 352 may not be in contact with the common voltage line 420, but may be in contact with the peripheral passivation layer 182 to enhance adhesive force of the peripheral partition wall 352.

The common electrode 730 is also formed on the peripheral partition wall 352, the peripheral passivation layer 182, and the common voltage line 420 in the peripheral area S. Since the heights of the upper surface of the common voltage line 420, the upper surface of the edge portion 182a of the peripheral passivation layer 182, and the upper surface of the edge portion 352a of the peripheral partition wall 352 are increased in this order to form a step, step coverage of the common electrode 730 is improved.

Further, it is possible to prevent the edge portion 352a of the peripheral partition wall 352 having a large thickness from being lifted up by forming the peripheral passivation layer 182 having a small thickness, so that it is possible to prevent the common electrode 730 covering the upper surface of the peripheral partition wall 352 from being short-circuited, thereby removing an abnormal heating phenomenon of the organic light emitting diode display.

Further, adhesive force between the peripheral passivation layer 182 that is the organic layer and the peripheral partition wall 352 that is the organic layer is excellent, so that it is possible to thickly form the peripheral partition wall 352 and the pixel partition wall 351, thereby minimizing a parasitic capacitor generated between the common electrode 730 and the transistors T1 and T2.

While this disclosure has been described in connection with what is presently considered to be practical embodiments, it is to be understood that the disclosure is not limited to the disclosed embodiments, but, on the contrary, is intended to cover various modifications and equivalent arrangements included within the scope of the appended claims, detailed description of the disclosure, and drawings.

What is claimed is:

1. An organic light emitting diode display, comprising:
    a substrate comprising a major surface which comprises a pixel region and a peripheral region next to the pixel region;
    a transistor formed over the substrate and configured to switch a pixel;
    a pixel-area passivation layer formed over the transistor;
    a pixel electrode formed over the pixel-area passivation layer;
    a pixel partition wall layer formed over the pixel-area passivation layer and covering an edge portion of the pixel electrode, the pixel partition wall layer defining a pixel opening;
    an organic light emission layer received in the pixel opening and placed over the pixel electrode;
    a common electrode formed over the organic light emission layer and the pixel partition wall layer, wherein the transistor, the pixel-area passivation layer, the pixel electrode, the pixel partitioning wall layer, the organic light emission layer and the common electrode are formed over the pixel region;

a common voltage line formed over the substrate and configured to transmit a common voltage to the common electrode while being in contact with the common electrode;

a peripheral passivation layer formed over the substrate and covering an end portion of the common voltage line; and a peripheral partition wall layer formed over the peripheral passivation layer and spaced apart from the common voltage line when viewed in a viewing direction perpendicular to the major surface, wherein the common voltage line, the peripheral passivation layer and the peripheral partition wall layer are formed over the peripheral region.

2. The organic light emitting diode display of claim 1, wherein, when viewed in the viewing direction, the peripheral partition wall layer is positioned between the common voltage line and the pixel region while being spaced apart from the common voltage line.

3. The organic light emitting diode display of claim 2, wherein the peripheral partition does not overlap an edge portion of the peripheral passivation layer when viewed in the viewing direction.

4. The organic light emitting diode display of claim 3, wherein the edge portion of the peripheral passivation layer is formed to be tapered at an inclination angle smaller than about 30°.

5. The organic light emitting diode display of claim 3, wherein heights of an upper surface of the common voltage line, an upper surface of the edge portion of the peripheral passivation layer, and an upper surface of the edge portion of the peripheral partition wall layer are increased in this order to form a step.

6. The organic light emitting diode display of claim 1, wherein a thickness of the peripheral passivation layer is smaller than a thickness of the pixel-area passivation layer.

7. The organic light emitting diode display of claim 6, wherein the thickness of the peripheral passivation layer is larger than a thickness of the common voltage line and is smaller than a thickness of the peripheral partition wall layer.

8. The organic light emitting diode display of claim 7, wherein the thickness of the peripheral partition wall layer is larger than a thickness of the pixel partition wall layer.

9. The organic light emitting diode display of claim 8, wherein a sum of the thicknesses of the pixel-area passivation layer and the pixel partition wall layer is the same as a sum of the thicknesses of the peripheral passivation layer and the peripheral partition wall layer.

10. The organic light emitting diode display of claim 1, wherein the transistor includes a gate electrode, a semiconductor, a source electrode, and a drain electrode, and wherein the common voltage line is formed of the same material as that of the source electrode and the drain electrode.

11. The organic light emitting diode display of claim 10, wherein the common voltage line is in contact with a portion of the common electrode which is not covered by the peripheral passivation layer.

12. The organic light emitting diode display of claim 11, further comprising:

a common voltage pad to which the common voltage is applied from the outside; and a common voltage connecting part configured to connect the common voltage pad and the common voltage line, wherein the common voltage connecting part is formed of the same material as that of the gate electrode.

13. An organic light emitting display device, comprising:

a substrate comprising a surface which comprises a pixel region and a peripheral region next to the pixel region;

a plurality of thin film transistors formed over the pixel region;

a common voltage line formed over the peripheral region;

a passivation layer formed over the pixel region and the peripheral region, the passivation layer covering the plurality of transistors;

a plurality of pixel electrodes formed over the pixel region, each of the plurality of pixel electrodes being disposed over the passivation layer and electrically connected to one of the plurality of thin film transistors;

a pixel defining layer formed over the pixel region and the peripheral region, the pixel defining layer defining a plurality of pixel openings, each of which overlaps one of the plurality of pixel electrodes;

a plurality of organic light emitting layers formed over the pixel region, each of the plurality of organic light emitting layers being disposed in one of the pixel openings and over one of the plurality of pixel electrodes; and a common electrode formed over the pixel region and the peripheral region, the common electrode being disposed over the pixel defining layer and the plurality of organic light emitting layers, the common electrode being disposed over and contacting the common voltage line, wherein the passivation layer comprises a portion contacting the common electrode, the portion overlapping the common voltage line but not overlapping the pixel defining layer when viewed in a direction perpendicular to the surface of the substrate.

14. The device of claim 13, wherein the pixel defining layer does not comprise a portion that overlaps the common voltage line when viewed in the direction.

15. The device of claim 13, wherein the pixel defining layer does not contact the common voltage line.

16. The device of claim 13, wherein the pixel defining layer is spaced from the common voltage line when viewed in the direction.

17. The device of claim 13, wherein the passivation layer further comprises another portion disposed over the peripheral region and not overlapping the common voltage line, wherein the portion has a thickness smaller than that of the other portion.

18. The device of claim 13, wherein each of the pixel defining layer, the passivation layer and the common voltage line comprises an edge disposed over the peripheral region, wherein the edge of the common voltage line is disposed between the edge of the passivation layer and the edge of the pixel defining layer.

19. The device of claim 13, wherein each of the thin film transistors comprises a gate electrode, wherein the device further comprises a common voltage connecting conductor layer formed over the peripheral region and contacting the common voltage line, wherein the common voltage line is disposed between the common voltage connecting conductor layer and the common electrode, wherein the common voltage connecting conductor layer is formed of a material the same as that of the gate electrode.

20. The device of claim 13, wherein each of the thin film transistor comprises a source electrode and a drain electrode, wherein the common voltage line is formed of a material the same as the source and drain electrodes.

* * * * *